US006762649B2

(12) United States Patent
Miller

(10) Patent No.: US 6,762,649 B2
(45) Date of Patent: Jul. 13, 2004

(54) SYSTEM AND METHOD FOR AUTOMATIC PARAMETER ADJUSTMENT WITHIN A PHASE LOCKED LOOP SYSTEM

(75) Inventor: Kevin Miller, Lawrenceville, GA (US)

(73) Assignee: Broadcom Corporation, Irvine, CA (US)

(*) Notice: Subject to any disclaimer, the term of this patent is extended or adjusted under 35 U.S.C. 154(b) by 27 days.

(21) Appl. No.: 10/304,956

(22) Filed: Nov. 27, 2002

(65) Prior Publication Data
US 2004/0100332 A1 May 27, 2004

(51) Int. Cl.[7] .............................................. H03L 7/093
(52) U.S. Cl. ............................. 331/17; 331/1 A; 331/25
(58) Field of Search ........................... 331/1 A, 16, 17, 331/18, 25; 327/156–159; 332/127; 360/51; 375/376; 455/260

(56) References Cited

U.S. PATENT DOCUMENTS 5,402,452 A * 3/1995 Powell et al. ................ 375/372

* cited by examiner

Primary Examiner—David Mis
(74) Attorney, Agent, or Firm—Sterne, Kessler, Goldstein & Fox P.L.L.C.

(57) ABSTRACT

A signal recovery system and methods to quickly acquire signal lock and maintain consistent performance of the signal recovery system for different signal input rates of an input signal is provided. The system includes a phase locked loop system and a parameter controller. The method includes monitoring an input signal, determining a signal input rate of the input signal, providing shift factors to a loop filter contained within the signal recovery system, and adjusting the phase locked loop system performance based on the shift factors. The performance factors that can be modified include the acquisition rate, loop bandwidth, and damping factor of the phase locked loop system within the signal recovery system.

9 Claims, 5 Drawing Sheets

SYSTEM AND METHOD FOR AUTOMATIC PARAMETER ADJUSTMENT WITHIN A PHASE LOCKED LOOP SYSTEM

BACKGROUND OF THE INVENTION

1. Field of the Invention

The present invention relates to phase locked loop systems, and more particularly, to automatically adjusting parameters within a phase locked loop system to enhance performance.

2. Background of the Invention

In the last several years distributed computing and communications systems that rely on or provide high speed data communications have become nearly ubiquitous. Such systems may include, but are not limited to, broadband communication systems using cable modems, satellite communication systems, fiber to the home (FTTH) communications networks, and board-to-board interconnections in a myriad of electronic devices.

In many of these systems, a remote electronic device must replicate a signal provided by another electronic device. One of the more common reasons an electronic device replicates a signal provided by another device is to provide clock synchronization between two or more electronic devices. There are many reasons why remotely distributed devices may need to have their clocks synchronized. In particular, in a digital communication system the receiving device must be properly synched to a sending device to enable the efficient processing and interpretation of an incoming data stream.

Phase locked loop (PLL) systems are typically used to facilitate synchronization of remotely located devices. A PLL system is a feedback system in which the feedback signal is used to lock the output frequency and phase to the frequency and phase of an input signal. FIG. 1 illustrates the basic architecture of a PLL system. As depicted in FIG. 1 the basic components include phase detector 110, loop filter 120 and voltage controlled oscillator 130. Phase locked loops can be analog or digital with the majority being composed of both analog and digital components.

In the basic PLL system illustrated in FIG. 1, input signal V(t) 140 is applied to one input of phase detector 110 while the output signal X(t) 170 is applied to the other input of phase detector 110. The output of phase detector 110, E(t) 150, is a function of the phase difference between V(t) 140 and X(t) 170. Loop filter 120 filters out undesirable components from E(t) 150 and provides further control over the loop's frequency response. Thus, loop filter 120 produces an output signal, Y(t) 160, that is primarily a function of the phase difference between V(t) 140 and X(t) 170.

Voltage controlled oscillator 130 is an oscillator whose output frequency is a linear function of its input voltage over some range of input voltages. A positive voltage will cause the frequency of the output signal of voltage controlled oscillator 130 to be greater than its uncontrolled value, while a negative voltage will cause it to be less. When an input signal has a frequency and phase within a certain range, known as the capture range, the PLL system will go through a series of cycles in which the difference between V(t) 140 and X(t) 170 becomes smaller and smaller until the signals are substantially the same. The system is said to be "locked", when the frequency and the phase of V(t) 140 and X(t) 170 are substantially the same. If the input signal has a frequency and phase outside the capture range, the system will not achieve lock and V(t) 140 and X(t) 170 may diverge, instead of converging.

Acquisition rate is a key performance characteristic of a PLL system. Acquisition rate refers to the rate at which a PLL system achieves lock, that is, to generate an output signal, such as X(t) 170 that has the same phase and frequency as an input signal, such as V(t) 140. Acquisition rate is a function of a variety of factors. Among these factors are the quality of the circuit components, the range of the input signal frequency and phase, and the characteristics of the input signal (e.g., digital or analog, noise levels, etc.).

As communication speeds have increased, there has been a need to improve acquisition rates. There are two basic situations when a PLL system needs to acquire lock to an input signal. These situations are upon system start-up and following the loss of lock during operation. When a PLL system is acquiring lock upon system start-up, the throughput degradation attributable to a slow acquisition rate may not be perceptible. However, when a system is operating and lock is lost, having a slow acquisition rate may significantly degrade performance. While start-up acquisition, by definition, only occurs once, re-acquisition during operation may occur many times. Because the re-acquisition occurs while data is likely being transmitted, data may be lost. The longer the re-acquisition, the more data is lost and the greater the time needed to recover the data. Thus, minimizing the acquisition time plays an important role in maximizing system throughput, particularly in environments where the signal or PLL lock may be lost frequently.

The damping factor is another key performance characteristics of a PLL system. The damping factor refers to the PLL system response to a change in the characteristics of the input signal. In particular, when there is a change in the input signal phase, the damping factor will determine the PLL system gain. If this gain is too large the PLL system will lose lock. Additionally, the damping factor determines how quickly ringing (i.e., a decaying sinusoidal variation in the output voltage of a loop filter) will cease following a change in the input signal phase. The sinusoidal variations will introduce undesirable jitter into the replicated signal. Thus, having a fast decay rate is often desirable.

The loop bandwidth is another key performance characteristics of a PLL system. The loop bandwidth refers to the range of operating frequencies where a PLL system has a predictable and desirable response. During initial signal acquisition, the loop bandwidth should be such that the frequency of the input signal lies within the loop bandwidth. Once signal acquisition has occurred, the loop bandwidth should include the frequency of the input signal, but ideally be as small as possible to reduce unwanted noise.

One type of communications system where PLL systems are commonly used is a cable modem-based broadband communications system. Within a cable modem-based broadband communication system the two principle devices are cable modems and cable modem termination systems. In a broadband communications network that uses cable modems, typically many cable modems are connected to a single cable modem termination system. Cable modems are located at customer premises and typically connected to personal computers through an Ethernet connection. Cable modem termination systems are typically located within a service provider's network center, often known as a headend location. Cable modem termination systems exchange data with multiple cable modems at high speeds. Importantly, cable modem termination systems transmit clock signals to cable modems for synchronization that is critical to ensuring efficient operation and high throughput.

Cable modem networks transmit data at high speeds that require optimization of circuitry and procedures. In particular, in a cable modem network in the downstream direction (from the network to a user's computer) network speeds can reach 40 Mbps—an aggregate amount of bandwidth that is shared by multiple users. In some systems network speeds can reach speeds approaching 100 Mbs. Typically, the downstream speed per user is on the order of 1 to 3 Mbps. Thus, if acquisition of a clocking signal delays transmission of data by only a tenth of second, the cable modem termination system will be prevented from sending 4.0 Mb of data. Depending on how often clock synchronization is lost, this could result in a performance degradation of up to 10%. This is unlikely because clock synchronization is not typically lost once a second. Nonetheless, as service providers receive greater and greater pressure from consumers for higher speed transmission rates, it is critical for circuitry and procedures to be optimized.

Similarly, once an input signal has been acquired, being able to control the damping factor and loop bandwidth dynamically can enhance performance. Within a digital PLL system, for example, the damping factor and loop bandwidth will change as the input signal rate changes. Thus, to ensure that the desired damping factor and loop bandwidth is achieved, dynamic adjustments must be made. By controlling the damping factor and loop bandwidth, noise contained within the output signal of the PLL system and the probability of losing signal lock can be reduced.

When dealing with systems that are transmitting data at megabit speeds, such as current broadband cable modem communications systems, minimizing acquisition time, reducing noise and avoiding lose of signal is critical. While there currently are approaches to aid a PLL system to achieve lock and to reduce acquisition rates, these approaches are either relatively slow given current communication speeds or require complex circuitry. Likewise, adjusting the damping factor and loop bandwidth dynamically requires the use of an external processor that is not always cost effective.

SUMMARY OF THE INVENTION

The invention is directed to a signal recovery system and methods to quickly acquire signal lock and maintain consistent performance of the signal recovery system for different input rates of an input signal. The system includes a phase locked loop system and a parameter controller. The method includes monitoring an input signal, determining the signal input rate of the input signal, providing shift factors to a loop filter contained within the signal recovery system, and adjusting the PLL system performance based on the shift factors. The performance factors that can be modified include the acquisition rate, loop bandwidth, and damping factor of the PLL system within the signal recovery system.

In one embodiment of the invention, the invention is implemented within a cable modem. In this embodiment, the invention is used to enhance the ability of the cable modem to achieve and sustain synchronization to a clock signal received from a cable modem termination system. In this embodiment, a cable modem termination system transmits a clock signal to a cable modem, pursuant to requirements in DOCSIS 2.0. DOCSIS 2.0 is an industry standard describing the protocols required for use between cable modems and cable modem termination systems. The cable modem must lock onto the clock signal and replicate it locally for efficient operation. The invention is used to achieve signal lock quickly, and to enhance the ability of the cable modem to sustain signal lock.

Use of the invention provides three principal benefits. First, use of the invention provides a significant improvement in the time it takes for a remote electronic device to lock onto a signal from another electronic device. Second, use of the invention increases the likelihood that signal lock will not be lost when there are changes in the input signal phase or frequency. Third, use of the invention enables the loop bandwidth to be smaller and the damping factor to be more stable than if the invention was not used, thereby reducing unwanted noise and jitter in the output signal of the signal recovery system.

Collectively, the benefits of the invention improve the operational efficiency and enable data throughput rates to be higher than they would be without the use of the invention.

Further embodiments, features, and advantages of the invention, as well as the structure and operation of the various embodiments of the invention are described in detail below with reference to accompanying drawings.

BRIEF DESCRIPTION OF THE FIGS.

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 2:
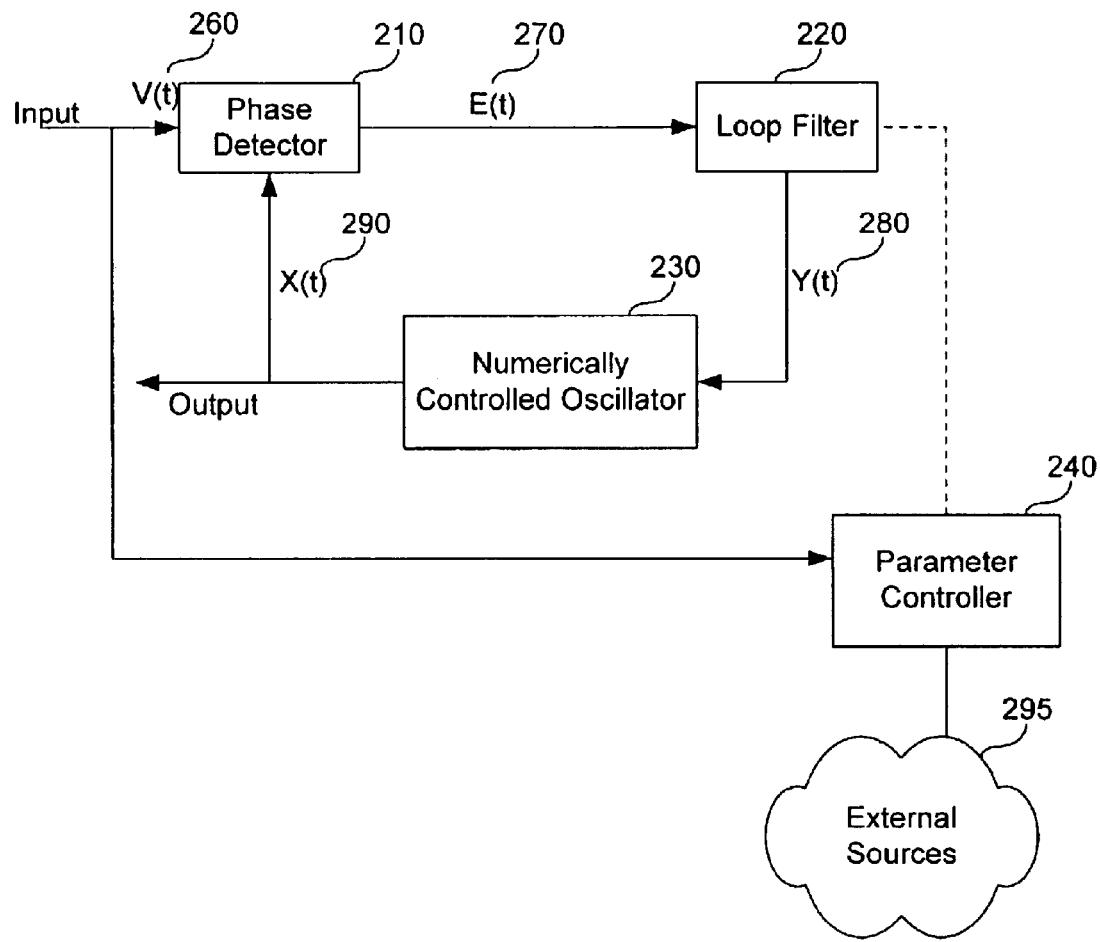
FIG. 2 is a diagram of a signal recovery system, according to an embodiment of the invention.

FIG. 2 illustrates signal recovery system 200, according to an embodiment of the invention. Timing recovery system 200 includes phase detector 210, loop filter 220, numerically controlled oscillator 230, and parameter controller 240. The solid and dashed lines between these components represent electrical connections. Signal recovery system 200 may be used to quickly achieve signal lock between a first and second electronic device, and to improve loop performance once lock is obtained. Signal recovery system 200 may be implemented with integrated circuits and components that are readily known to individuals skilled in the relevant art(s).

Phase detector 210, loop filter 220 and numerically controlled oscillator 230 comprise a PLL system. Parameter controller 240 enhances the operation of the PLL system by accelerating the acquisition rate of the phase locked loop and improves system performance once the system has locked onto or acquired the input signal, V(t) 260. External sources 295 provide control and management of parameter controller 240. External sources 295 may be other systems or circuitry that are external to signal recovery system 200, such as an administrative module responsible for the overall operation of a device in which signal recovery system 200 is contained.

During the signal acquisition process, parameter controller 240 provides a series of parameters to loop filter 220. These parameters can be based on pre-determined loop bandwidths and damping factors that can be such that at the beginning of, and early on in the acquisition process, the parameters force signal recovery system 200 to have a large loop bandwidth and low damping. As the acquisition proceeds, the bandwidth can be reduced to decrease the effects of noise injection. Similarly, the damping factor will be increased to minimize ringing and overshoot of the loop. Once the signal acquisition process has completed, and signal recovery system 200 has locked onto input signal, V(t) 260, parameter controller 240 monitors the signal input rate and provides parameters to loop filter 220 to compensate for any changes in the input rate.

Figure 3:
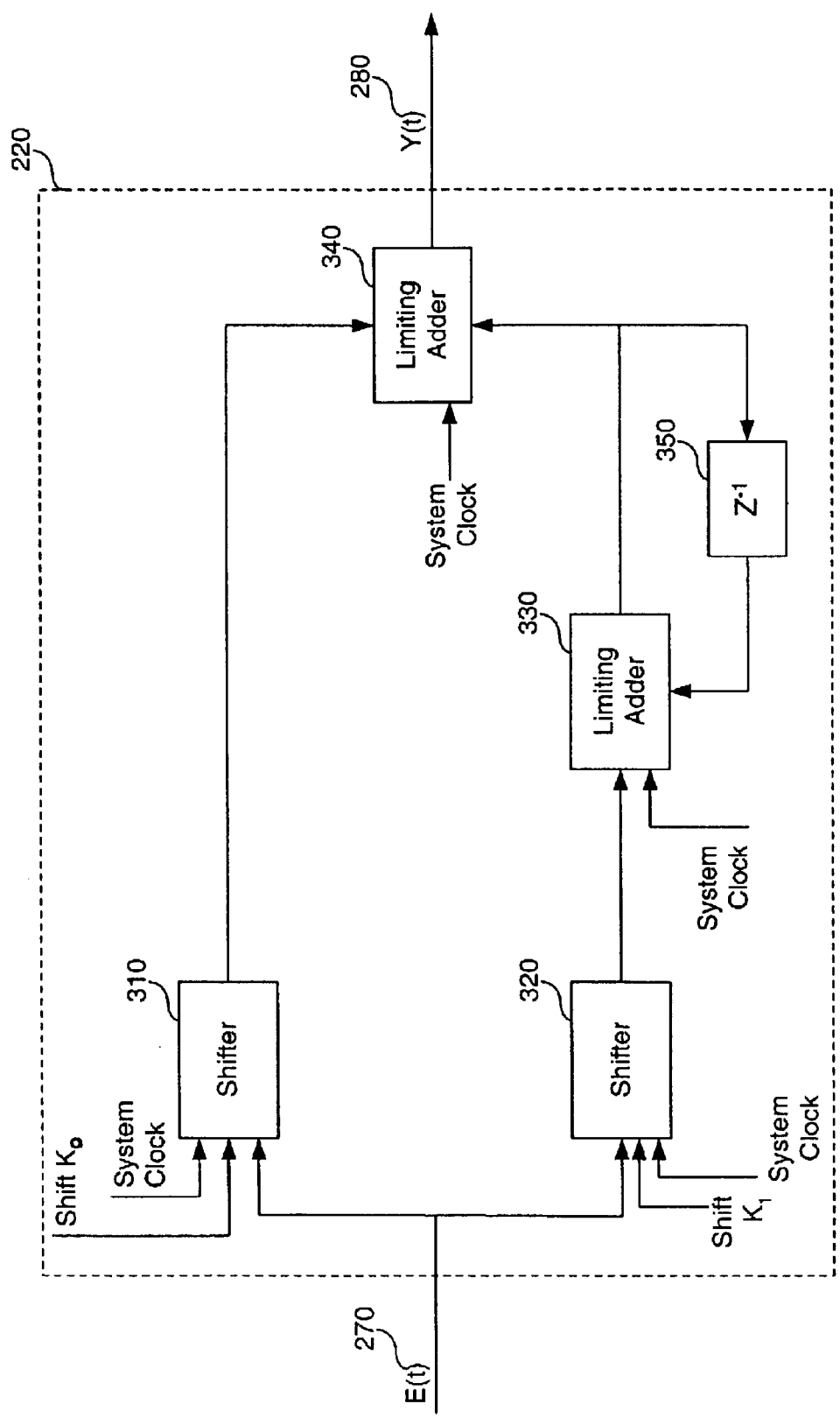
FIG. 3 is a diagram of a loop filter, according to an embodiment of the invention.

FIG. 3 provides a digital implementation for loop filter 220, according to an embodiment of the invention. Such an implementation of the filter can be used in cable modems. Loop filter 220 includes shifter 310, shifter 320, limiting adder 330, limiting adder 340 and unit delay device 350. The solid lines between these components represent electrical connections. Each of the components, except unit delay device 350, receives as one of its inputs, a system clock signal. Parameter controller 240 modifies loop filter 220 characteristics by providing a shift_k0 signal to shifter 310, and a shift_k1 signal to shifter 320. The basic operation of loop filter 220 will be known to individuals skilled in the relevant art(s).

An exemplary embodiment of signal recovery system 200 has been presented. The invention is not limited to this example. This example is presented herein for purposes of illustration, and not limitation. Alternatives (including equivalents, extensions, variations, deviations, alternative approaches to combining functionality, etc., of those described herein) will be apparent to persons skilled in the relevant art(s) based on the teachings contained herein. Such alternatives fall within the scope and spirit of the invention.

Figure 1:
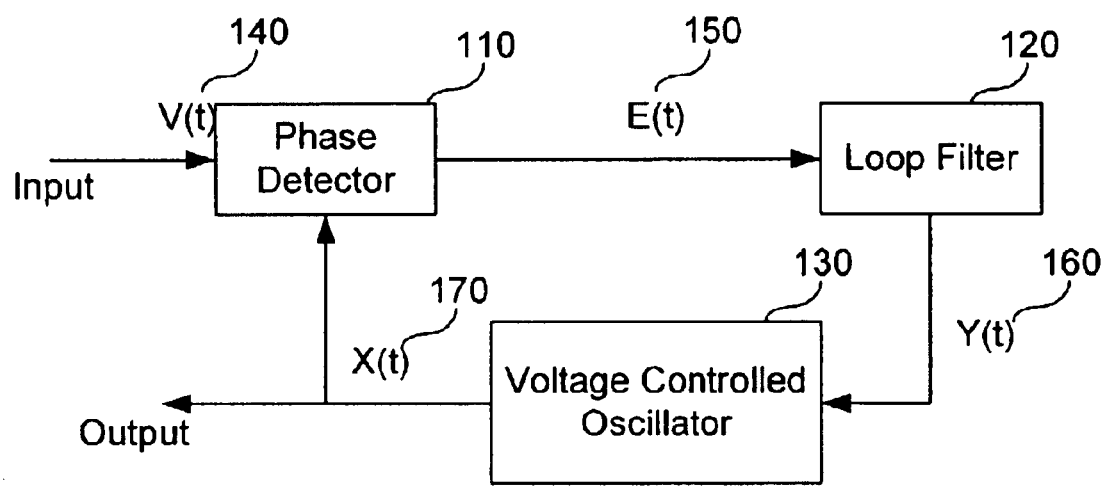
FIG. 1 is a diagram of a basic phase locked loop system.

In one embodiment of the invention, signal recovery system 200 may be used to achieve clock synchronization between a cable modem and a cable modem termination system. In this embodiment, V(t) 260 represents an input signal containing a clock value sent by a cable modem termination system to a cable modem. As in the basic PLL system illustrated in FIG. 1, input signal V(t) 260 is applied to one input of phase detector 210 while the output signal X(t) 290 is applied to the other input of phase detector 210. The output of the phase detector, E(t) 270, is a function of the phase difference between V(t) 260 and X(t) 290. Loop filter 220 filters out undesirable components from E(t) 270 and provides further control over the loop's frequency response. Thus, loop filter 220 produces an output signal, Y(t) 280, that is primarily a function of the differences in phases between V(t) 260 and X(t) 290.

The input signal, V(t) 260 contains a timestamp value based on a clock located in the cable modem termination system. The cable modem seeks to lock onto this input signal, and replicate it locally through the use of signal recovery system 200.

As discussed above, PLL systems have certain measures of performance, such as acquisition rate, loop bandwidth and damping factor, that define loop characteristics both dynamically and statically. Typically, these performance measures have been derived to achieve design goals associated with the use of the PLL system, and ideally will be met regardless of the environment within which the PLL system is used. In the case of a PLL system that is implemented digitally, for example, the signal input rate to the system, which may be referred to as the loop update rate, has a direct, first order effect on both the loop bandwidth and damping factor. The invention dynamically adjusts the loop bandwidth and damping factor, based on the maturity of the signal acquisition process and/or changes in the loop update rate. The adjustments are made by providing shift parameters to loop filter 220.

Figure 4:
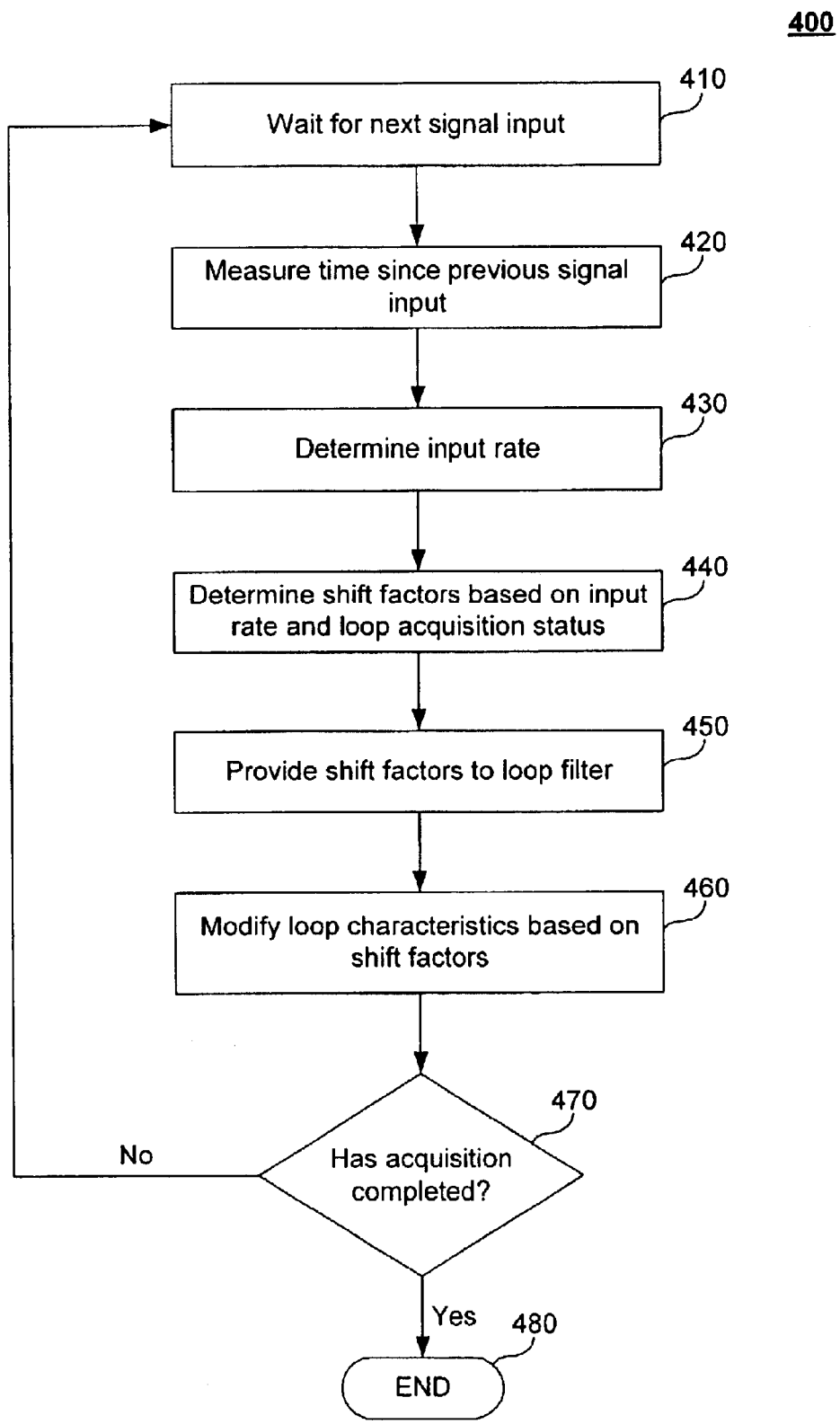
FIG. 4 is a method for accelerating the acquisition rate of a phase locked loop system contained in a signal recovery system, according to an embodiment of the invention.

FIG. 4 illustrates method 400 for accelerating the acquisition rate of a PLL system, according to an embodiment of the invention. The method begins in step 410. In step 410, a system waits for a next signal input, from an input signal, such as V(t) 260. For example, V(t) 260 may be an input signal containing clock pulses. A system would wait for a next signal input, which in this example would be a next clock pulse. When a next input signal is detected, method 400 proceeds to step 420. In step 420, the time since the previous input signal is measured. In one embodiment, a timer within a parameter controller, such as parameter controller 240, can be used to measure the time since the previous signal input. The timer may or may not be reset after receiving a signal input. In step 430, the input rate is determined. In one embodiment, when the local timer is reset after each signal input, the input rate will be equal to the timer value. Alternatively, if the local timer is not reset after each input signal, the input rate can be calculated by subtracting the previous timer value from the current timer value.

In step 440, shift factors are determined. In one embodiment, parameter controller 240 determines the shift factors. The shift factors can consist of two shift factors, shift_k0 and shift_k1, that are provided to loop filter 220 to result in the desired loop bandwidth and damping factor. The shift factors may be determined in a variety of ways. In one approach, target loop bandwidths and damping factors can be contained in parameter controller 240. The choice of loop bandwidth and damping factor can be based on the desired PLL system performance and the maturity of the signal acquisition process. In this case, parameter controller 240 will determine the desired loop bandwidth and damping factor based on the maturity of the signal acquisition process. Parameter controller 240 will then determine shift_k0 and shift_k1 based on the input rate to achieve the desired loop bandwidth and damping factor for the present stage of the acquisition process.

The determination of values for shift_k0 and shift_k1 can occur in a number of ways. In one approach, a discrete matrix that maps shift factors to different input rates for desired loop bandwidths and damping factors is contained within parameter controller 240. When parameter controller 240 recognizes a difference in an input rate from the previous input rate, parameter controller 240 accesses the matrix to determine what the appropriate shift factors would be for the new input rate. Another approach would be to implement an algorithm within parameter controller 240 that computes the shift factors in real time based on the input rate and desired loop bandwidth and damping factor, rather than relying on a predetermined matrix of values. Depending on the loop performance characteristics that are desired, individuals skilled in the relevant art(s) will be able to develop and apply the appropriate algorithm. Other approaches for determining shift factors will be known to individuals skilled in the relevant art(s) and based on the teachings herein.

In step 450, the shift factors are provided to a loop filter, such as loop filter 220. In one embodiment, parameter controller 240 provides shift_k0(l) to shifter 310 and shift_k1(l) to shifter 320, where shift_k0(l) represents the first value for shift_k0(n) and shift_k1(l) represents the first value for shift_k1(n) that is provided to loop filter 220.

In step 460, the PLL system characteristics are modified according to the shift factors. In one embodiment, by applying shift factors to shifters 310 and 320, loop filter 220 is modified and the resulting loop bandwidth and damping factors are achieved.

In step 470, a determination is made as to whether the signal acquisition process has been completed. In one embodiment, parameter controller 240 will contain a routine to provide different sets of shift factors until a preset number of signal inputs have been received. In this case, parameter controller 240 will keep providing shift factors to loop filter 220, until a preset number of signal inputs has been received. For example, parameter controller 240 may be preprogrammed to achieve four different loop bandwidths and damping factors during four stages as the PLL system moves through the signal acquisition process, while a preset number of signal inputs are being received. If a preset number of signal inputs have been received, thereby indicating that the signal acquisition process has been completed, method 400 will proceed to step 480 and end. In one embodiment, method 400 will immediately proceed to method 500, which is discussed below, to enter into a tracking or maintenance mode to dynamically adjust the performance of the PLL system. If a determination is made that the preset threshold for the number of input signals has not been reached and the acquisition process is not complete, method 400 returns to step 410 and repeats steps 410 through 470.

Figure 5:
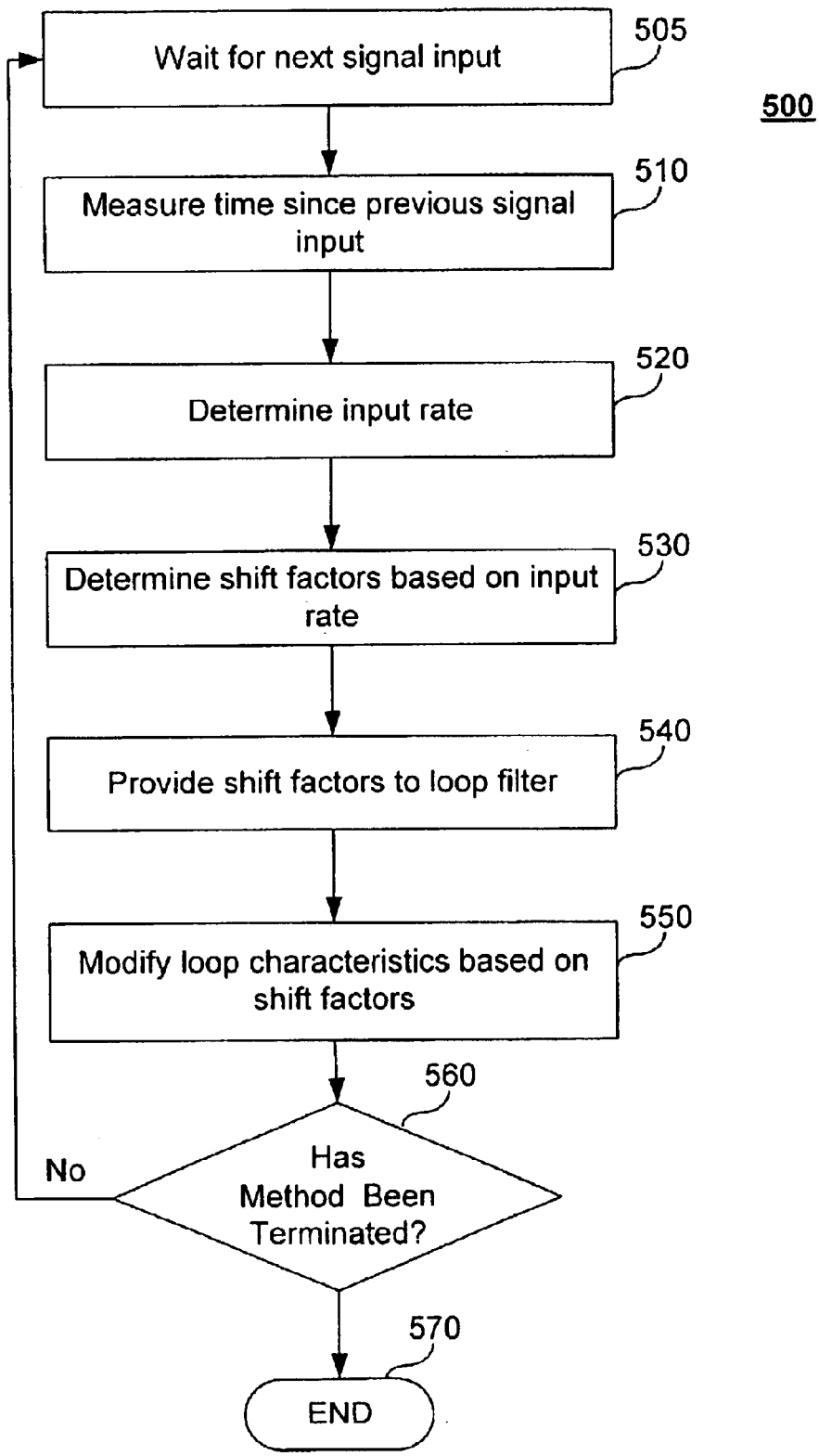
FIG. 5 is a method for dynamically adjusting a phase locked loop system to maintain a desired loop bandwidth and damping factor, according to an embodiment of the invention.

FIG. 5 illustrates method 500, for dynamically adjusting loop parameters after initial signal acquisition to maintain a desired loop bandwidth and damping factor. The principal difference between method 500 and method 400 is that in method 500, the PLL system has already acquired lock and therefore the decision on what loop bandwidth and damping factor is desired does not change based on the number of signal inputs received.

The method begins in step 505. In step 505, a system waits for a next signal input, from an input signal, such as V(t) 260. For example, V(t) 260 may be an input signal containing clock pulses. A system would wait for a next signal input, which in this example would be a next clock pulse. When a next input signal is detected, method 500 proceeds to step 510. In step 510, the time since the previous input signal is measured. In one embodiment, a timer within a parameter controller, such as parameter controller 240, can be used to measure the time since the previous signal input. The timer may or may not be reset after receiving a signal input. In step 520, the input rate is determined. In one embodiment, when the local timer is reset after each signal input, the input rate will be equal to the timer value. Alternatively, if the local timer is not reset after each input signal, the input rate can be calculated by subtracting the previous timer value from the current timer value.

In step 530, shift factors are determined. In one embodiment, parameter controller 240 determines the shift factors. The shift factors can consist of two shift factors, shift_k0 and shift_k1, that are provided to loop filter 220 to result in the desired loop bandwidth and damping factor. A target loop bandwidth and damping factor can be contained in parameter controller 240. The determination of values for shift_k0 and shift_k1 can occur in a number of ways. In one approach, a discrete matrix that maps shift factors to different input rates for a desired loop bandwidth and damping factor is contained within parameter controller 240. When parameter controller 240 recognizes a difference in an input rate from the previous input rate, parameter controller 240 accesses the matrix to determine what the appropriate shift factors would be for the new input rate. Another approach would be to implement an algorithm within parameter controller 240 that computes the shift factors in real time based on the input rate and desired loop bandwidth and damping factor, rather than relying on a predetermined matrix of values. Depending on the loop performance characteristics that are desired, individuals skilled in the relevant art(s) will be able to develop and apply the appropriate algorithm. Other approaches for determining shift factors will be known to individuals skilled in the relevant art(s) and based on the teachings herein.

In step 540, the shift factors are provided to a loop filter, such as loop filter 220. In one embodiment, parameter controller 240 provides shift_k0(l) to shifter 310 and shift_k1(l) to shifter 320, where shift_k0(l) represents the first value for shift_k0(n) and shift_k1(l) represents the first value for shift_k1(n) that is provided to loop filter 220.

In step 550, the PLL system characteristics are modified according to the shift factors. In one embodiment, by applying shift factors to shifters 310 and 320, loop filter 220 is modified and the resulting loop bandwidth and damping factors are achieved.

In step 560, a determination is made whether method 500 has been terminated. If the method has been terminated, the method proceeds to step 570 and ends. If the method has not been terminated, the method proceeds back to step 505. In one embodiment, the method will run continuously and repeatedly loop through steps 505 through step 560, until for example the electronic device running the method is powered off.

Conclusion

While various embodiments of the invention have been described above, it should be understood that they have been presented by way of example, and not limitation. Alternatives (including equivalents, extensions, variations, deviations, etc., of those described herein) will be apparent to persons skilled in the relevant art(s) based on the teachings contained herein. It will be apparent to persons skilled in the relevant art that various changes in form and detail can be made therein without departing from the spirit and scope of the invention.

What is claimed is:

1. A signal recovery system of an electronic device, comprising:
   a phase locked loop system;
   a parameter controller electrically coupled to said phase locked loop system that provides a set of shift factors to a loop filter contained within said phase locked loop system.

2. The signal recovery system of claim 1, wherein the electronic device is a cable modem.

3. A method for accelerating the acquisition rate of a phase locked loop system, comprising:
   (a) determining a signal input rate for an input signal to the phase locked loop system;
   (b) determining a set of shift factors;
   (c) providing the set of shift factors to a loop filter contained within the phase locked loop system;
   (d) adjusting the phase locked loop system loop bandwidth and damping factor using the set of shift factors; and
   (e) repeating step (a) through step (d) until the phase locked loop system has received a specified number of signal inputs.

4. The method of claim 3, wherein step (b) comprises obtaining a set of shift factors based on a desired loop bandwidth and damping factor from predetermined sets of shift factors.

5. The method of claim 3, wherein step (b) comprises calculating a set of shift factors based on a desired loop bandwidth and damping factor.

6. The method of claim 3, wherein step (b) comprises determining a set of shift factors based on a maturity stage in a signal acquisition process.

7. A method for dynamically adjusting a phase locked loop system to maintain a desired loop bandwidth and damping factor, comprising:

(a) determining a signal input rate for an input signal to the phase locked loop system;

(b) determining a set of shift factors;

(c) providing the set of shift factors to a loop filter contained within the phase locked loop system; and (d) adjusting the phase locked loop system loop bandwidth and damping factor using the set of shift factors.

8. The method of claim 7, wherein step (b) comprises obtaining a set of shift factors based on a desired loop bandwidth and damping factor from predetermined sets of shift factors.

9. The method of claim 7, wherein step (b) comprises calculating a set of shift factors based on a desired loop bandwidth and damping factor.

* * * * *